(12) United States Patent
Shih

(10) Patent No.: US 8,524,603 B1
(45) Date of Patent: Sep. 3, 2013

(54) FABRICATING METHOD FOR SEMICONDUCTOR DEVICE

(75) Inventor: Ting-Chen Shih, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/472,599

(22) Filed: May 16, 2012

(51) Int. Cl.
*H01L 21/302* (2006.01)
*H01L 21/461* (2006.01)

(52) U.S. Cl.
USPC ........................................................ 438/692

(58) Field of Classification Search
USPC .......................................... 438/692; 216/89
See application file for complete search history.

(56) References Cited

U.S. PATENT DOCUMENTS 7,064,072 B1 * 6/2006 Ting et al. ..................... 438/700
7,846,792 B2 12/2010 Terahara \* cited by examiner

*Primary Examiner* — Roberts Culbert
(74) *Attorney, Agent, or Firm* — WPAT, PC; Justin King

(57) ABSTRACT

A fabricating method of a semiconductor device is provided. First, a substrate having a first surface and a second surface opposite to each other is provided. A shallow trench is formed on the first surface, and a first nitride layer is formed on the second surface. A dielectric layer is formed on the first surface of the substrate to cover the shallow trench. Then, the first nitride layer is removed, and a first protective layer is formed on the second surface of the substrate. After that, a planarization process is performed to remove a portion of the dielectric layer outside the shallow trench. The fabricating method is capable of improving the fabricating yield of semiconductor device.

14 Claims, 4 Drawing Sheets

FABRICATING METHOD FOR SEMICONDUCTOR DEVICE

TECHNICAL FIELD

The present invention relates generally to a fabricating method for a semiconductor device, and more particularly to a fabricating method for a semiconductor device that is capable of improving the yield.

BACKGROUND

Generally, semiconductor devices are formed on the front surface of a wafer, therefore the exposed back surface of the wafer is prone to be roughed due to be damaged during the fabricating process of the semiconductor devices.

As such, it is hard for the wafer to maintain a horizontal attitude when placed on a machine, and thus in the following lithography process the problem of defocusing occurs.

SUMMARY

A fabricating method of a semiconductor device is provided. First, a substrate having a first surface and a second surface opposite thereto is provided. A shallow trench is formed on the first surface, and a first nitride layer is formed on the second surface. A dielectric layer is formed on the first surface of the substrate to cover the shallow trench. Then, the first nitride layer is removed, and a first protective layer is formed on the second surface of the substrate. After that, a planarization process is performed to remove a portion of the dielectric layer outside the shallow trench.

In the above method, the nitride layer on the back surface of the substrate is firstly removed and then a protective layer is formed on the back surface prior to forming the STI structure. As such, the back surface is protected by the protective layer from being damaged. In addition, since the nitride layer is removed from the back surface, the thickness evenness of the films formed on the front surface in the following process can be maintained.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
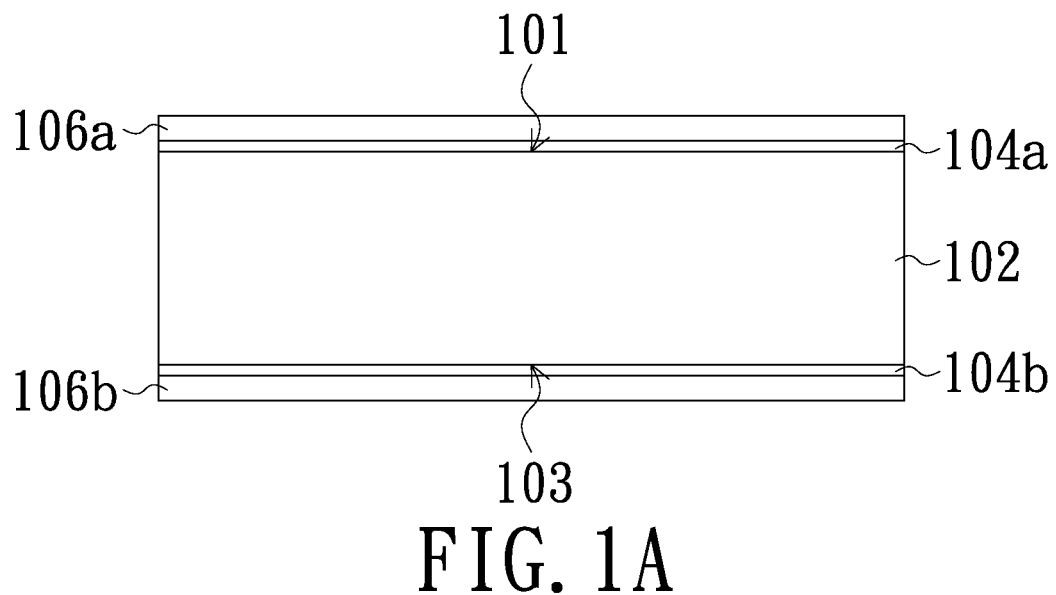
FIGS. 1A to 1E are cross sectional schematic views illustrating a fabricating method of a semiconductor device in accordance with a first embodiment.

FIGS. 1A to 1E are cross sectional schematic views illustrating a fabricating method of a semiconductor device in accordance with a first embodiment. Referring to FIG. 1A, firstly, a substrate 102 is provided. The substrate 102 has a first surface 101 and a second surface 103 opposite to each other. The substrate 102, for example, is a silicon substrate. In present embodiment, the first surface 101 is the front surface of the substrate 102 and the second surface 103 is the back surface of the substrate 102. That is, semiconductor devices are intended to be formed on the first surface 101.

A pad oxide layer 104a and an etching stopping layer 106a are already formed on the first surface 101 of the substrate 102. In detail, the pad oxide layer 104a and the etching stopping layer 106a, for example, are sequentially formed on the first surface 101 of the substrate 102 by a furnace depositing method. Thus, a pad oxide layer 104b and a first nitride layer 106b are also respectively formed on the second surface 103 of the substrate 102 during the processes of forming the pad oxide layer 104a and the etching stopping layer 106a. In other words, the pad oxide layer 104a and the pad oxide layer 104b have the same thickness and consist of the same material; the first nitride layer 106b and the etching stopping layer 106a have the same thickness and consist of the same material. In the present embodiment, the material of the pad oxide layer 104a and 104b, for example, is silicon oxide, and the thickness thereof is about 110 angstroms. The material of the etching stopping layer 106a and the first nitride layer 106b, for example, is silicon nitride, and the thickness thereof is about 1500 angstroms.

Figure 1B:
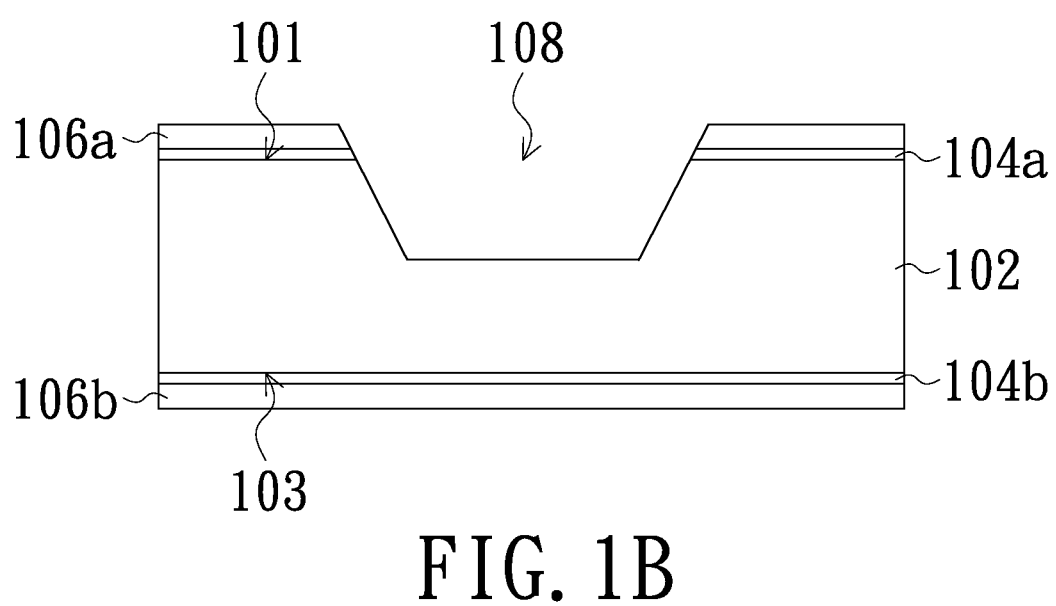

Referring to FIG. 1B, portions of the etching stopping layer 106a and the pad oxide layer 104a on the first surface 101 are removed to expose a portion of the substrate 102, and then the exposed portion of the substrate 102 is removed to form a shallow trench 108. In detail, the method of forming the shallow trench 108 includes forming a photoresist layer (not shown) on a surface of the etching stopping layer 106a firstly, and then performing a lithography process to define a pattern within the photoresist layer. An etching process is performed to etch the etching stopping layer 106a and the pad oxide layer 104a till a portion of the first surface 101 of the substrate 102 corresponding to the pattern is exposed. Then, the photoresist layer is removed, and the substrate 102 is continuously etched using the remained etching stopping layer 106a and the pad oxide layer 104a as the etching mask to form the shallow trench 108.

Figure 1C:
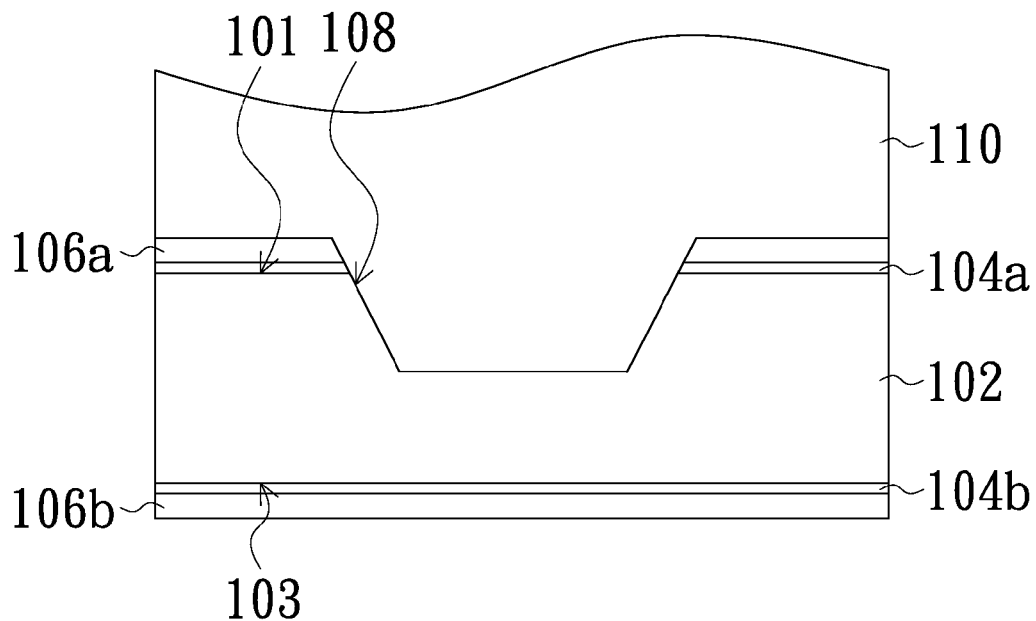

After that, referring to FIG. 1C, a dielectric layer 110 is formed on the first surface 101 of the substrate 102 to cover the shallow trench 108. In the present embodiment, the dielectric layer 110, for example, is formed by using a high density plasma chemical vapor deposition method (HDP CVD), and a thickness of the dielectric layer 110 is about 2000 to 6000 angstroms. The dielectric layer 110 is used for fulfilling the shallow trench 108 and then a shallow trench isolation (STI) may be formed to isolate the active areas. According to the requirements of different processes or devices, the dielectric layer 110 may be a single-layer or a multi-layer including a plurality of dielectric materials, such as silicon oxide, silicon nitride, silicon carbide or silicon carbide nitride, and the thickness or the manufacturing method are not limited to the aforementioned.

Figure 1D:
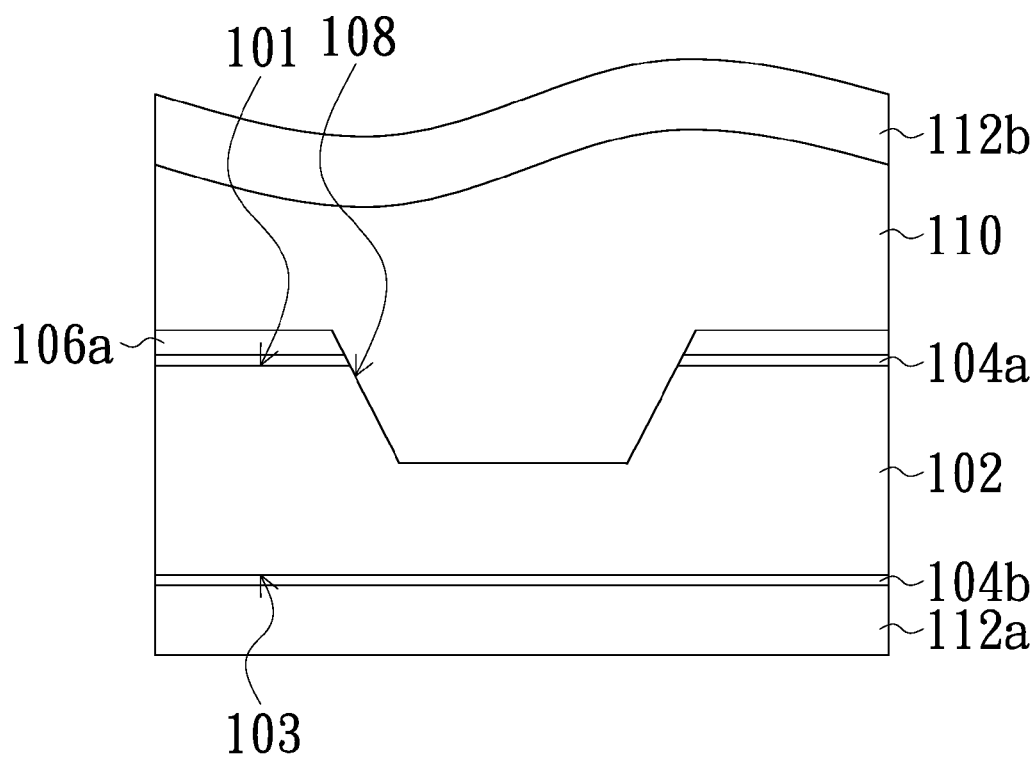

Then, as shown in FIG. 1D, the first nitride layer 106b on the second surface 103 of the substrate 102 is removed and a first protective layer 112a is formed on the second surface 103. In the present embodiment, the material of the first protective layer 112a, for example, is silicon oxide deposited by using tetraethoxysilane (TEOS) as a precursor, and a thickness thereof is in a range from 300 to 1000 angstroms. The first protective layer 112a, for example, is formed on the second surface 103 of the substrate 102 by using a furnace depositing method. Thus, a second protective layer 112b is also formed on the first surface 101 of the substrate 102 simultaneously. The second protective layer 112b has a same thickness and consists of the same material with the first protective layer 112a. Additionally, in the present embodiment, the dielectric layer 110 is firstly formed on the substrate 110, and then the first protective layer 112a is formed. Thus, the second protective layer 112b, which is simultaneously formed with the first protective layer 112a, is formed on the dielectric layer 110.

Figure 1E:
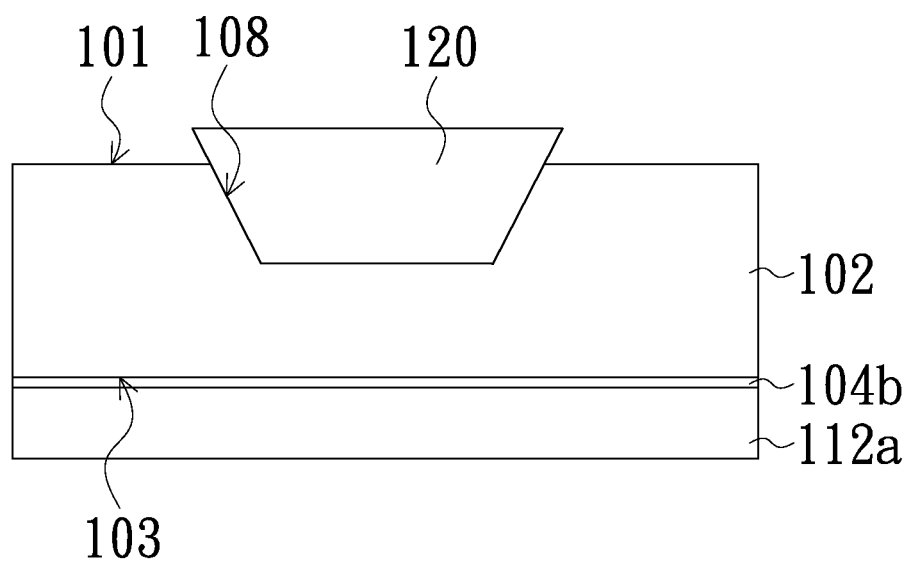

Then, as shown in FIG. 1E, a planarization process, such as dry etching process, wet etching process, chemical mechanical polishing (CMP) process or combinations thereof, is performed on the first surface 101 to smooth the first surface 101 of the substrate 102. In the CMP process, the etching stopping layer 106a is used as a stop layer. That is, the dielectric layer 110 on the etching stopping layer 106a is removed, and a surface of the portion of the dielectric layer 110 that is located within the shallow trench 108 is aligned with the surface of the etching stopping layer 106a. Then, a wet etching process is used to selectively remove the etching stopping layer 106a, and the portion of the dielectric layer 110 that is located within the shallow trench 108 form a shallow trench isolation (STI) structure 120.

As the second protective layer 112b is formed on the dielectric layer 110, the second protective layer 112b can also be removed in the above CMP process without any additional process.

After the STI structure 120 is formed on the first surface 101 of the substrate 102, the following processes may be performed to form metal oxide semiconductor (CMOS) devices, memory devices or other semiconductor devices on the first surface 101 of substrate 102. During the fabricating processes of these semiconductor devices, the first protective layer 112a covers the second surface 103 of the substrate 102, and since there is an difference of etching rate between the first protective layer 112a and the etching stopping layer 106a in an etching liquid, even a wet etching process is performed with the films formed on the first surface 101 of the substrate 102, the etchant will only etch the first protective layer 112a but won't attack the second surface 103 of the substrate 102. For example, the material of the first protective layer 112a is silicon oxide and the material of the etching stopping layer 106a is silicon nitride, so that the etching stopping layer 106a can be selectively removed based on the difference of etching rate between the two materials in hot phosphoric acid. As such, the accuracy of the following lithography process is improved. Accordingly, the yield rate is improved.

It should be noted that in the depositing process of the gate dielectric layer, multiple substrates 102 are placed at regular intervals from top to bottom of a wafer cassette. For example, a plurality of wafers placed in the wafer cassette are simultaneously deposited or thermal oxidized in furnace tube. However, this configuration also lead to a problem that the film formed on the second surface 103 of the upper substrate 102 would affect the thickness of the gate dielectric layer formed on the first surface 101 of the lower substrate 102. In order to maintain the uniform thickness of each dielectric layer on the substrates 102, in the present embodiment, the first nitride layer 106b on the second surface 103 of the substrate 102 is firstly removed and then the first protective layer 112a is formed.

Figure 2A:
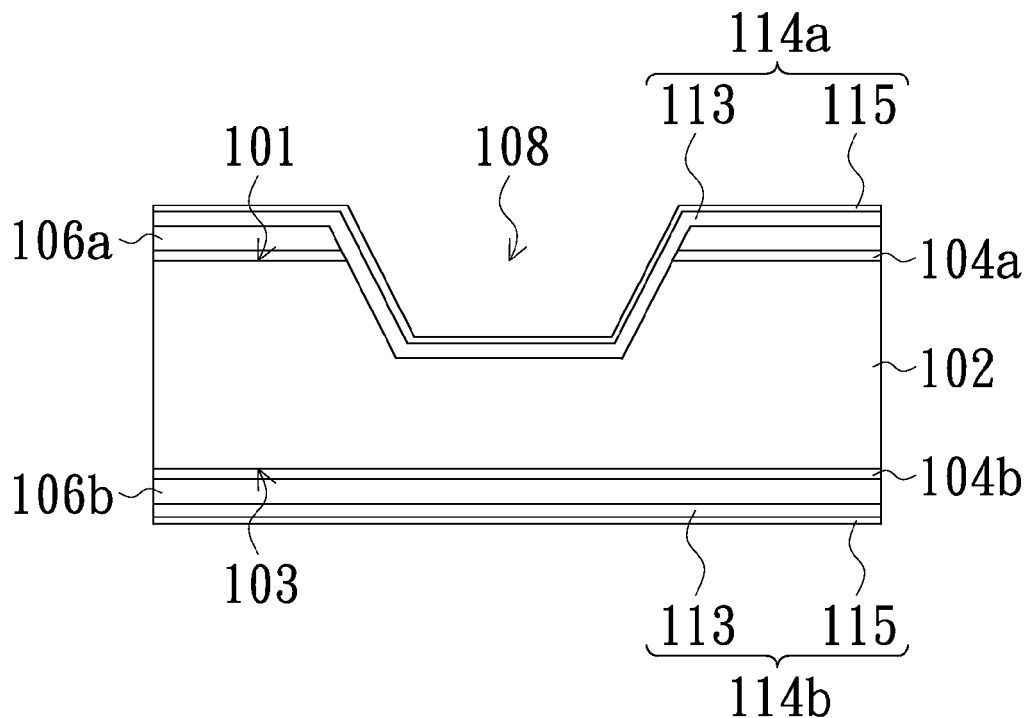
FIGS. 2A to 2B are cross sectional schematic views illustrating a fabricating method of a semiconductor device in accordance with a second embodiment.

Furthermore, in FIG. 1B, because the shallow trench 108 is formed on the first surface 101 of the substrate 102 by using a dry etching process, the etching gases used in the dry etching process would damage the silicon lattice in the shallow trench 108. Therefore, in another embodiment, as shown in FIG. 2A, before the formation of the dielectric layer 110, a first liner layer 114a can be formed on the bottom and inner sidewall of the shallow trench 108 to protective the bottom and the inner sidewall of the shallow trench 108 and repair the damaged lattice structure in the dry etching process.

The first liner layer 114a can also be formed by a furnace depositing process on the bottom and inner sidewall of the shallow trench 108, thus, there is also a second liner layer 114b of the same material and thickness simultaneously formed on the second surface 103 of the substrate 102. In addition, the first liner layer 114a and the second liner layer 114b can be in a single-layer structure or a multi-layer structure. In the present embodiment, the first liner layer 114a and the second liner layer 114b are composite layer including an oxide layer 113 and a second nitride layer 115. A thickness of the oxide layer 113, for example, is about 150 angstroms, and a thickness of the second nitride layer 115, for example, is about 90 angstroms. However, in other embodiments, the first liner layer 114a and the second liner layer 114b can also be a single layer of silicon oxide, and the present invention doesn't limit the configuration thereof.

Figure 2B:
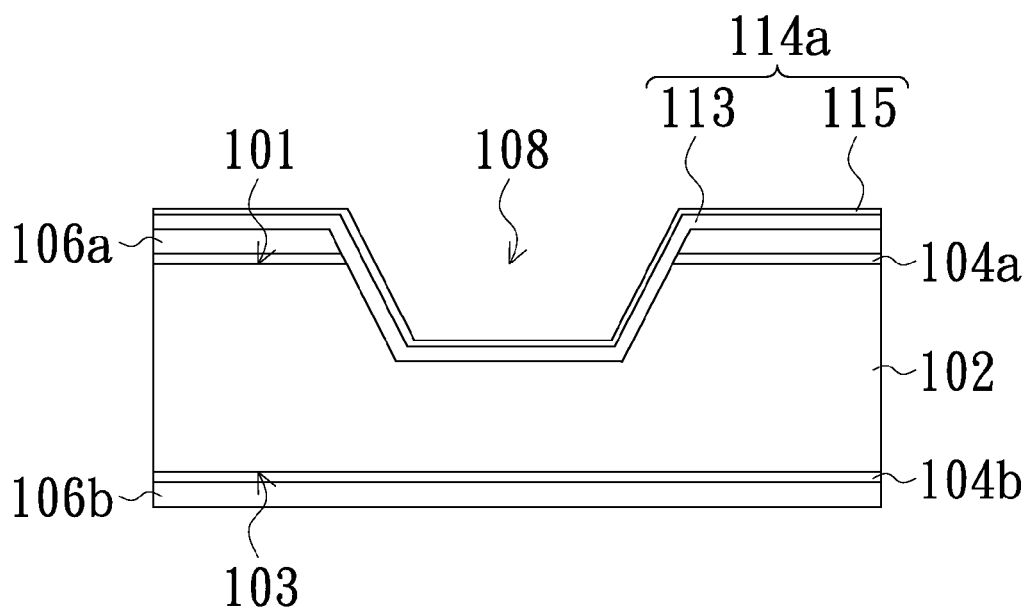

As shown in FIG. 2B, the second liner layer 114b should be removed prior to removing the first nitride layer 106b on the second surface 103 of the substrate 102. In the present embodiment, different etchants are used to remove the second nitride layer 115 and the oxide layer 113, respectively. Then, the process as shown in FIGS. 1D and 1E are performed to remove the first nitride layer 106b to form the first protective layer 112a and the STI structure 120.

In the above embodiments, the nitride layer on the back surface of the substrate is firstly removed and then a protective layer is formed on the back surface prior to forming the STI structure. As such, the back surface is protected by the protective layer from being damaged. In addition, since the nitride layer is removed from the back surface, the thickness evenness of the films formed on the front surface in the following process can be maintained. Furthermore, the protective layer is formed on the back surface after the dielectric layer is formed to cover the shallow trench and prior to the CMP process to the dielectric layer, thus, even another protective layer is simultaneously formed on the front surface, it can also be removed using the CMP process without any additional removing process to avoid resulting harm in the following process performed on the front surface of the substrate.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a semiconductor device, comprising:

providing a substrate having a first surface and a second surface opposite thereto, a shallow trench being formed on the first surface, and a first nitride layer being formed on the second surface;

forming a dielectric layer on the first surface of the substrate to cover the shallow trench;

removing the first nitride layer;

after removing the first nitride layer, forming a first protective layer on the second surface of the substrate; and after forming the first protective layer, performing a planarization process to remove a portion of the dielectric layer outside the shallow trench.

2. The fabricating method of claim 1, further comprising forming a first liner layer on the first surface of the substrate to cover a bottom and an inner sidewall of the shallow trench prior to forming the dielectric layer.

3. The fabricating method of claim 2, wherein a second liner layer is simultaneously formed on the second surface of the substrate with the first liner layer, and the method further comprises removing the second liner layer prior to removing the first nitride layer.

4. The fabricating method of claim 3, wherein the first liner layer and the second liner layer are formed with a furnace depositing method.

5. The fabricating method of claim 2, wherein a second liner layer is simultaneously formed on the second surface of the substrate while the first liner layer is formed on the first surface, the second liner layer comprises an oxide layer and a second nitride layer, and the oxide layer is formed between the second nitride layer and the first nitride layer.

6. The fabricating method of claim 1, wherein a second protective layer is simultaneously formed on the dielectric layer while the first protective layer is formed on the second surface and the second protective layer is removed in the planarization process.

7. The fabricating method of claim 6, wherein the first protective layer and the second protective layer are formed with a furnace depositing method.

8. The fabricating method of claim 1, wherein a thickness of the first protective layer is in a range from 300 angstroms to 1000 angstroms.

9. The fabricating method of claim 1, wherein the material of the first protective layer comprises silicon oxide.

10. The fabricating method of claim 1, wherein the method of forming the shallow trench on the first surface comprises:
    forming a pad oxide layer on the first surface;
    forming an etching stopping layer on the pad oxide layer; and
    removing portions of the etching stopping layer, portions of the pad oxide layer and portions of the substrate to form the shallow trench.

11. The fabricating method of claim 10, further comprising removing the etching stopping layer after the planarization process.

12. The fabricating method of claim 10, wherein the etching stopping layer and the first nitride layer are formed in a same process.

13. The fabricating method of claim 12, wherein the first nitride layer and the etching stopping layer are formed with a furnace depositing method.

14. The fabricating method of claim 1, wherein the planarization process comprises chemical mechanical polishing process.

* * * * *